(12) United States Patent
Mellies et al.

(10) Patent No.: US 7,417,016 B2
(45) Date of Patent: Aug. 26, 2008

(54) COMPOSITION FOR THE REMOVING OF SIDEWALL RESIDUES

(75) Inventors: Raimund Mellies, Dieburg (DE); Marc Boerner, Darmstadt (DE); Lucia Arnold, Muenster (DE); Andrea Barko, Stockstadt (DE); Rudolf Rhein, Heppenheim (DE)

(73) Assignee: BASF SE, Ludwigshafen (DE)

( * ) Notice: Subject to any disclaimer, the term of this patent is extended or adjusted under 35 U.S.C. 154(b) by 69 days.

(21) Appl. No.: 10/518,463

(22) PCT Filed: May 27, 2003

(86) PCT No.: PCT/EP03/05549

§ 371 (c)(1),
(2), (4) Date: Dec. 20, 2005

(87) PCT Pub. No.: WO04/001834

PCT Pub. Date: Dec. 31, 2003

(65) Prior Publication Data

US 2006/0086372 A1    Apr. 27, 2006

(30) Foreign Application Priority Data

Jun. 22, 2002    (DE) ................. 102 27 867

(51) Int. Cl.
*G03F 7/42* (2006.01)
*C25F 3/12* (2006.01)

(52) U.S. Cl. .............. 510/176; 510/375; 134/1.3; 134/3; 438/800; 438/963; 216/104; 216/109

(58) Field of Classification Search .............. 510/176, 510/375; 134/3, 1.3; 438/800, 963; 216/104, 216/109
See application file for complete search history.

(56) References Cited

U.S. PATENT DOCUMENTS

| | | | |
|---|---|---|---|
| 5,294,570 A | 3/1994 | Fleming, Jr. et al. | |
| 5,486,266 A * | 1/1996 | Tsai et al. | 438/750 |
| 6,043,206 A | 3/2000 | Song et al. | |
| 6,273,959 B1 | 8/2001 | Oonishi et al. | |
| 6,383,723 B1 * | 5/2002 | Iyer et al. | 430/327 |
| 6,605,230 B1 * | 8/2003 | Liaw et al. | 216/104 |
| 6,656,852 B2 * | 12/2003 | Rotondaro et al. | 438/749 |
| 6,773,959 B2 * | 8/2004 | Yau | 438/109 |
| 6,953,533 B2 * | 10/2005 | Kool et al. | 216/109 |

FOREIGN PATENT DOCUMENTS

| | | |
|---|---|---|
| EP | 0477504 | 4/1992 |
| EP | 0811666 | 12/1997 |
| JP | 10-125462 A | 5/1998 |
| JP | 2001-144044 A | 5/2001 |
| WO | WO 9736209 | 10/1997 |

* cited by examiner

*Primary Examiner*—David M Brunsman
(74) *Attorney, Agent, or Firm*—Millen, White, Zelano, Branigan, P.C.

(57) ABSTRACT

The present invention relates to a composition for the removal of so-called "sidewall residues" from metal surfaces, in particular from aluminium or aluminium-containing surfaces, in particular from aluminium or aluminium-containing surfaces, during the production of semiconductor elements.

10 Claims, 13 Drawing Sheets

Stripping results in the SEZ spin etcher with various H2SiF6 concentrations.

Residual polymers unstripped

After stripping with 100 ppm of $H_2SiF_6$

After stripping with 500 ppm of $H_2SiF_6$

After stripping with 1000 ppm of $H_2SiF_6$

After stripping with 100 ppm of HF

After stripping with 200 ppm of HF

After stripping with 500 ppm of HF

Stripping results in a Mattson AWP tank processor with various $H_2SiF_6$ concentrations.

After stripping with 100 ppm of $H_2SiF_6$

After stripping with 600 ppm of $H_2SiF_6$

Fig. 12: Result after use of a composition with added surfactant.

Comparison with Fig. 12: Result after use of a composition without added surfactant.

COMPOSITION FOR THE REMOVING OF SIDEWALL RESIDUES

This application is a 371 of PCT/EP03/05549, filed 27 May 2003.

The present invention relates to a composition for the removal of so-called "sidewall residues" from metal surfaces, in particular from aluminium or aluminium-containing surfaces, during the production of semiconductor elements.

PRIOR ART

Conductor tracks in integrated circuits consist principally of aluminium or an aluminium/copper alloy (0.5% of copper), which is deposited over the entire surface by sputtering. The structures are subsequently formed by coating with photoresist, exposure and development. In the subsequent dry-etching process, the aluminium is structured, during which polymers form, inter alia, from constituents of the photoresist and the etching gases and deposit as a continuous layer predominantly on the sidewalls of the aluminium conductor tracks. Even after removal of the photoresist by means of oxygen plasma or Caro's acid, these polymers remain on the conductor tracks. These so-called residual polymers, which are generally known as "sidewall residues", have to be removed completely before the production process is continued in order to ensure the function and reliability of the IC component. These "sidewall residues" are referred to as residual polymers below.

In conventional methods, the residual polymers are removed by a wet cleaning step by means of a solution known as stripper or stripper solution. Conventional strippers comprise a complexing agent, a corrosion inhibitor and a polar solvent. In the product EKC 265, which is the most frequently used, these components are hydroxylamine, monoethanolamine, catechol and water.

More recent developments have resulted in it also being possible to employ purely inorganic strippers. For example, WO 97/36209 A1 (Merck) describes compositions based on dilute sulfuric acid/hydrogen peroxide solutions (DSP). In U.S. Pat. Nos. 5,698,503 and 5,709,756, corresponding strippers based on ammonium fluoride solutions are used in turn.

Dilute sulfuric acid/hydrogen peroxide solutions (DSP) on their own are not sufficient for the removal of the residual polymers and therefore comprise additional additives. Such additives are, for example, small amounts of hydrofluoric acid in the concentration range from 10 to 100 mg/kg. The hydrofluoric acid has a slightly caustic action on aluminium and aluminium/copper alloys. The attack takes place over the entire surface without damaging the metallisation. Pitting corrosion, such as, for example, due to chloride ions, does not take place.

Due to the underetching, the residual polymer layer separates from the metal surface and is rinsed off by the liquid (lift-off). The metal surface exposed by the etching operation is subsequently re-passivated by the hydrogen peroxide.

The disadvantage in the use of hydrofluoric acid as etching additive consists in that the concentration must be maintained and monitored very accurately. An excessively high concentration would attack the metal surface excessively, while an inadequate hydrofluoric acid concentration does not achieve an adequate cleaning action.

Depending on the type of plants in which the stripper solution is to be employed, different HF concentrations are set. On use of the stripper solution in spin etchers, strippers whose HF concentration is 100 mg/kg are usually employed. By contrast, compositions whose HF concentration is merely 10 mg/kg are used in tank units.

In particular, the very low concentration of the solutions for use in tank units makes process control very complex. The concentration may only differ from the nominal value by a few ppm. This aim can only be achieved by continuous, precise measurement and controlled replenishment of hydrofluoric acid. This is only possible if the unit has on-line analysis and a corresponding metering system.

LITERATURE

Merck Patent WO97/36209. Solution and Process for Removal of Sidewall Residue after Dry Etching
Ashland. Technical Note, Fluoride-Containing Strippers
SEZ. Inorganic Chemical DSP
EP 0 773 480 A1, Remover solution composition for resist and method for removing resist using the same
EP 0 485 161 A1, Stripping composition and method of stripping resist from substrates
U.S. Pat. No. 5,698,503, Stripping and cleaning composition
U.S. Pat. No. 5,709,756, Basic stripping and cleaning composition
EP 0 596 515 B1, Alkaline photoresist stripping composition producing reduced metal corrosion

OBJECT

The object of the present invention consists in providing a stable composition or stripper solution for the removal of residual polymers, so-called "sidewall residues", which gives stable etching rates on aluminium or aluminium/copper alloys in a great concentration range of the additive, and completely removes the residual polymers described above without damaging the metallisation layers or conductor tracks or causing corrosion.

The object is achieved by a composition for the production of semi-conductors, comprising $H_2SiF_6$ and/or $HBF_4$ in a total amount of 10-500 mg/kg, 12-17% by weight of $H_2SO_4$, 2-4% by weight of $H_2O_2$, optionally in combination with additives, in aqueous solution.

The present invention thus relates to the use of a composition comprising $H_2SiF_6$ and/or $HBF_4$ as residual polymer remover in a process step in the production of semiconductors, in particular for the removal of residual polymers from Al or Al-containing conductor tracks.

These compositions are preferably used for the removal of residual polymers after dry etching on metal conductor tracks and contact holes. The present invention thus also relates to the use of this composition for the removal of residual polymers from aluminium or copper/aluminium alloys, in particular the use of compositions comprising $H_2SiF_6$ and/or $HBF_4$ in a total amount of 10-500 mg/kg, 12-17% by weight of $H_2SO_4$, 2-4% by weight of $H_2O_2$, optionally in combination with additives, in aqueous solution. These compositions are preferably used for the removal of residual polymers in a process step in the production of semiconductors using a spin etcher or in a tank unit.

In accordance with the invention, the compositions according to the invention are used in processes for the removal of residual polymers from Al or Al-containing conductor tracks.

DESCRIPTION OF THE INVENTION

As described, sulfuric acid and hydrogen peroxide as well as a fluorine-containing inorganic additive are the principal constituents of a stripper. The inorganic composition most frequently employed at present is the above-mentioned DSP mixture consisting of sulfuric acid, hydrogen peroxide and, as additive, pure hydrofluoric acid in the concentration range from 10 to 100 mg/kg.

If additives such as ammonium fluoride, tetramethylammonium fluoride or fluorophosphonic acid are employed instead of hydrofluoric acid, these exhibit the same etching behaviour on aluminium, i.e. a linear dependence on the fluoride concentration present in the stripper. A linear etching behaviour of this type as a function of the concentration of the etching component is shown in FIG. 1. for HF, $NH_4F$, TMAF and $H_2PO_3F$. The fact that the etching rates of all these additives are on a straight line in a graph suggests that the fluoride component in the acidic solution is converted completely into HF.

The etching behaviour of the fluorine compounds hexafluorosilicic acid and tetrafluoroboric acid, by contrast, is completely different, as experiments have shown. Although the etching rates initially increase with the concentration, they remain, however, virtually constant as the concentration is increased further. This behaviour is also shown in the graph in FIG. 1.

Although it is generally understood that hexafluorosilicic acid and tetrafluoroboric acid are strong acids, experiments have now shown that their use instead of the above-mentioned additives can advantageously affect the behaviour of stripper solutions. Even if these components are added in relatively small amounts, this positive effect is very clearly evident. However, it is not only the etching rates that can be advantageously affected by the addition of hexafluorosilicic acid and/or tetrafluoroboric acid; at the same time, passivation of the surfaces of the conductor tracks consisting of aluminium or aluminium alloys against corrosion is thereby achieved.

The "double" inhibitor action of these compounds enables this process step, which is necessary for the removal of residual polymers, to be carried out over a longer period and in a much greater concentration range with a constant stripper action.

Continuous measurement of the additive content and replenishment during the production process thus becomes superfluous. Equipment costs are thus saved and at the same time greater process safety is achieved.

Through the use of hexafluorosilicic acid and/or tetrafluoroboric acid in the composition in concentrations of from 100 to 500 mg/kg, residual polymers are removed with very good results, which can be confirmed by SEM studies. At the same time, no attack of the aluminium or aluminium alloys is evident in the said concentration range. The advantageous action of the hexafluorosilicic acid is evident in direct comparison with HF as additive. HF exhibits significant surface etching from only 100 mg/kg (see FIG. 3, picture 5).

The experiments are carried out using structured wafers having the following layer structure:

| | |
|---|---|
| SiO2 (thermal oxide substrate) | |
| titanium sputtered | 100 nm |
| aluminium sputtered (0.5% of Cu) | 900 nm |
| TiN sputtered | 100 nm |

The aluminium conductor tracks are structured by coating with photoresist, exposure and subsequent development and curing of the resist by UV irradiation.

The wafers are then etched in the etching chamber in an LAM TCP 9600 with $Cl_2/BCl_3$ and $N_2$ as etching gases.

The photoresist layer is removed by $O_2/H_2O$ plasma treatment in the stripping chamber, followed by treatment with warm water in a further chamber for the removal of chlorine (corrosion prevention).

The process for the removal of residual polymers after dry etching, i.e. the stripping process, is firstly developed in beaker experiments under reproducible conditions in accordance with DIN 50453. The process is subsequently transferred to an SEZ spin etcher and a Mattson AWP200 tank unit with the following process parameters:

| | SEZ spin etcher | Mattson AWP 200 |
|---|---|---|
| Etching: | 45-60 s at 25° C. | 45-90 s at 25° C. |
| Rinsing with ultrapure water: | 30 s at RT | 10 min. at RT |
| Drying: | $N_2$ | Marangoni |

The first experiments are carried out using a composition which corresponds to the DSP mixture currently being used, an aqueous solution of sulfuric acid with a concentration in the range between 12 to 17% by weight and hydrogen peroxide in a concentration in the range from 2 to 4% by weight. Use is made of $H_2SiF_6$ and $HBF_4$ individually here, but also of the combination of the two compounds as fluoride ion suppliers.

These experiments show that the addition of the individual fluoride ion suppliers $H_2SiF_6$ and $HBF_4$, but also in combination with one another, enables good removal of residual polymers to be achieved, with better passivation being caused by $H_2SiF_6$. Owing to this experimental result and owing to its better handling properties, the use of $H_2SiF_6$ is therefore to be preferred.

Solutions which are suitable per se for the removal of residual polymers after dry etching are those which comprise $H_2SO_4$ in a concentration in the range from 1 to 17% by weight. Particularly good results are achieved with compositions comprising from 12 to 17% by weight of $H_2SO_4$.

Compositions comprising $H_2O_2$ in the concentration range between 1 to 12% by weight have proven suitable for the removal of residual polymers. Preference is given to the use of compositions which comprise $H_2O_2$ in a concentration in the range from 2 to 4% by weight.

In these concentration ranges, the etching rates on aluminium are virtually constant and are determined only by the content of the additive. FIG. 2 shows the dependence of the etching rates on aluminium at a constant content of $H_2SiF_6$ of 500 mg/kg.

Particularly suitable compositions have proven to be those which comprise from 12 to 17% by weight of $H_2SO_4$, from 2 to 4% by weight of $H_2O_2$ and from 100 to 500 mg/kg of $H_2SiF_6$. Preference is given to corresponding composition in which the fluoride supplier is $H_2SiF_6$ in combination with $HBF_4$ and their total amount of the two compounds is from 100 to 500 mg/kg. A further preferred embodiment of the invention comprises compositions which comprise $HBF_4$ as the only fluorine-containing compound in an amount of from 100 to 500 mg/kg.

Experiments have shown that corresponding compositions are particularly suitable for the removal of residual polymers after dry etching on metal conductor tracks.

These aqueous compositions are particularly suitable for the removal of residual polymers from aluminium without attacking the metal.

Whereas the HF content in the DSP mixtures employed hitherto as strippers with pure HF as additive drops continuously compared with the compositions according to the invention if the process is carried out continuously, adversely affecting the cleaning action, consumed HF appears to be replenished continuously by $H_2SiF_6$ or $HBF_4$ as effective additive in an equilibrium reaction, so that the desired concentration apparently remains constant over an extended period. A solution stabilised in this way firstly enables the process safety to be significantly improved and secondly enables costs to be saved since there is no need for a technically complex on-line monitoring and metering system. Furthermore, the fluoride ion suppliers according to the invention are significantly less corrosive than pure HF solutions, both with respect to storage containers used and to the production plants, meaning that the fluoride ion suppliers according to the invention also contribute a considerable contribution towards process safety in this respect.

Examples are given below for illustrative purposes and for better understanding of the invention. Owing to the general validity of the present invention in the limits described, these examples are not suitable for restricting the invention merely to the values given in the examples.

EXAMPLES

Example 1

Etched wafers having the layer structure described above were processed in the SEZ spin etcher. This technology is a single-wafer process in which the wafer lying horizontally in a process chamber is set in rotation and impinged on by the etching liquid via a nozzle. In the process, the nozzle arm moves horizontally to and fro over the wafer surface. The etching process is followed by a rinsing process with ultra-pure water in accordance with the same principle. For drying, the wafer is finally blown dry with $N_2$ at a high rotational speed.

Step 1: Stripping
Composition of the mixture:

| Sulfuric acid: | 12.0% by weight |
|---|---|
| Hydrogen peroxide: | 2.4% by weight |
| H2SiF6: | 500 mg/kg |

600 rpm, 1 l/min through-flow, 25° C., 30 sec.
Step 2: Rinsing with ultrapure water
600 rpm, 1 l/min through-flow, 25° C., 30 sec.
Step 3: Spin drying with blowing off by N2
2000 rpm, 150 l/min.

FIG. 3 shows the fully cleaned surface, without attack of the metallisation. At concentrations above 500 mg/kg of H2SiF6, the metallisation is surface etched, see FIG. 3, picture 4 with 1000 mg/kg.

Example 2

The same wafers as in Example 1 were processed in a Mattson AWP200 tank unit.
Step 1: Stripping
Composition of the mixture:

| Sulfuric acid: | 12.0% by weight |
|---|---|
| Hydrogen peroxide: | 2.4% by weight |
| H2SiF6: | 100 mg/kg |

15 l/min. recirculation, 25° C., 45 s
Step 2: Rinsing with ultrapure water
35 l/min through-flow, 25° C., 10 min.
Step 3: Marangoni dryer
FIG. 3 shows the fully cleaned surface, without attack on the metallisation.

Example 3

The same wafers as in Example 1 were processed in a beaker. For better characterisation of the stripping process, wafers with very thick polymer layers were used.
Step 1: Stripping
Composition of the mixture:

| Sulfuric acid: | 12% by weight |
|---|---|
| Hydrogen peroxide: | 2.4% by weight |
| $H_2SiF_6$: | 100 mg/kg |
| Oenanthic acid: | 80 mg/kg |

100 rpm. 25° C., 60 sec.
Step 2: Rinsing with ultrapure water in the beaker
25° C., 5 min.
Step 3: Drying in the nitrogen oven
100° C., 10 min It can be seen in FIG. 12 that the polymers have been removed apart from a thin residual layer.

Comparative Example for Example 3

As reference, an identical wafer with the same composition, but without added surfactant was processed as above.

In FIG. 13, a significantly thicker polymer layer is evident.

The added surfactant thus wets the surface better, which has a positive effect on the stripping action.

The SEM photographs shown in the annex show the results of the removal of residual polymers using the compositions according to the invention. The results were achieved by stripping in an SEZ spin etcher using various $H_2SiF_6$ concentrations:

BRIEF DESCRIPTION OF THE DRAWINGS

FIGS. 4 to 6 show residual polymer-free conductor tracks. By comparison, FIG. 7 100 ppm of HF, FIG. 8 200 ppm of HF and FIG. 9 500 ppm of HF. On use of 100 ppm of HF, polymer residues and surface etching are still evident. Although the use of 200 ppm of HF results in virtually complete removal of the residual polymers, it also results in an increase in surface etching compared with the use of 100 ppm of HF. On use of compositions comprising 500 ppm of HF, very strong surface etching of the metal conductor tracks is found. FIG. 10 using 100 ppm of $H_2SiF_6$ and FIG. 11 using 600 ppm of $H_2SiF_6$. In these cases too, very good removal of residual polymers is found, with the surface etching remaining in acceptable limits even at 600 ppm.

Figure 1:
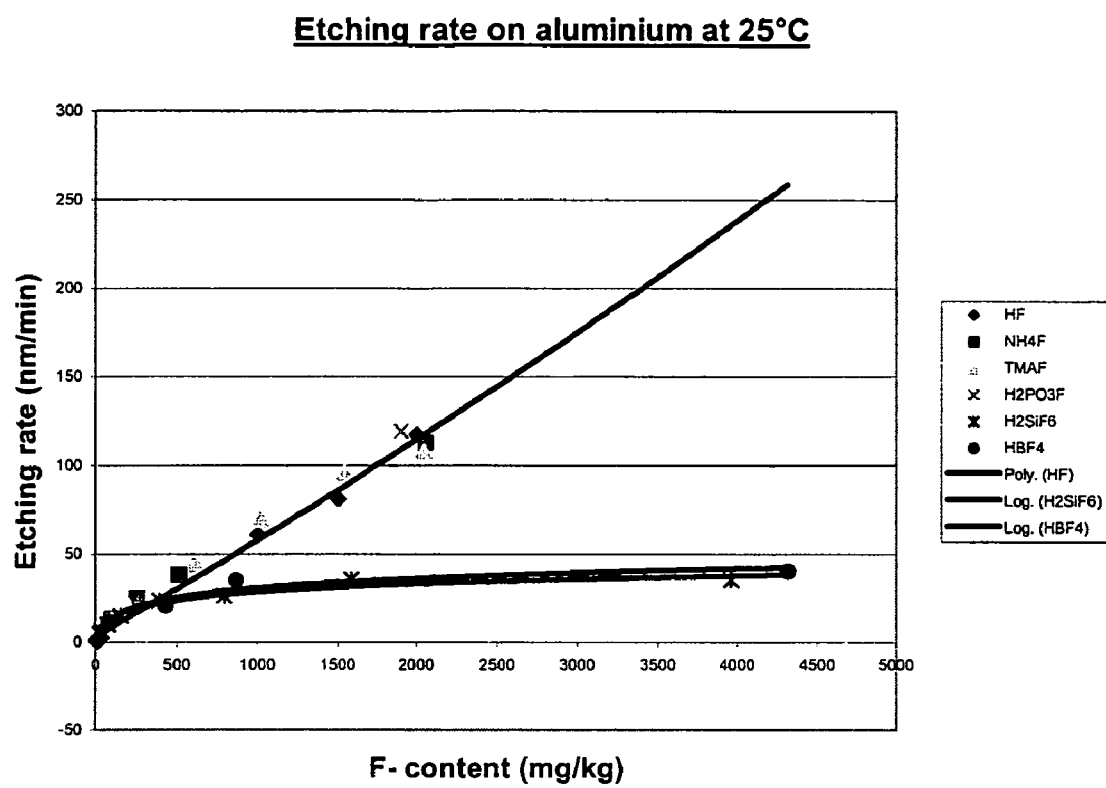
FIG. 1 shows the dependence of the etching rates on aluminum for a variety of etching components as a functions of fluorine content.
Figure 2:
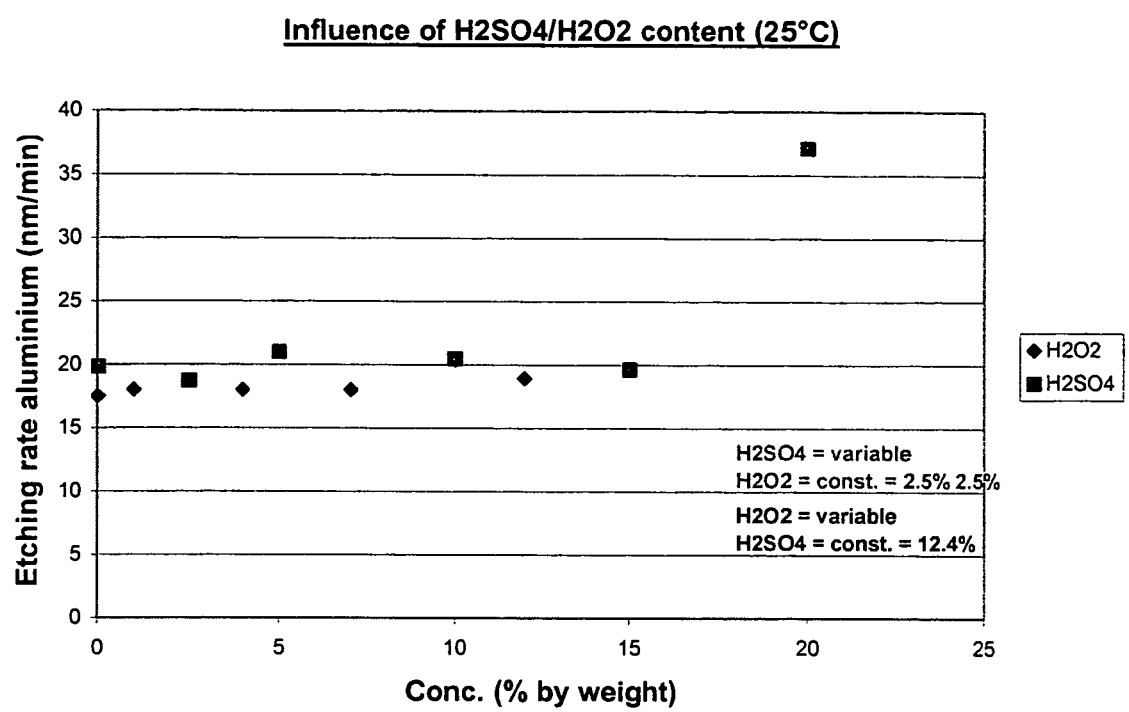
FIG. 2 shows the dependence of the etching rates on aluminum at a constant content of $H_2SiF_6$ of 500mg/kg.
Figure 3:
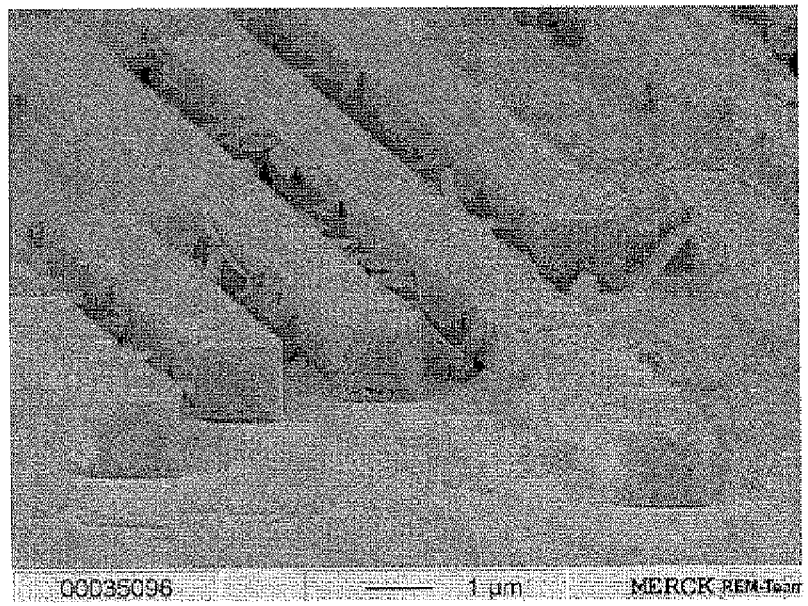
FIG. 3 shows a section of a wafer with aluminium conductor tracks before the treatment.
Figure 4:
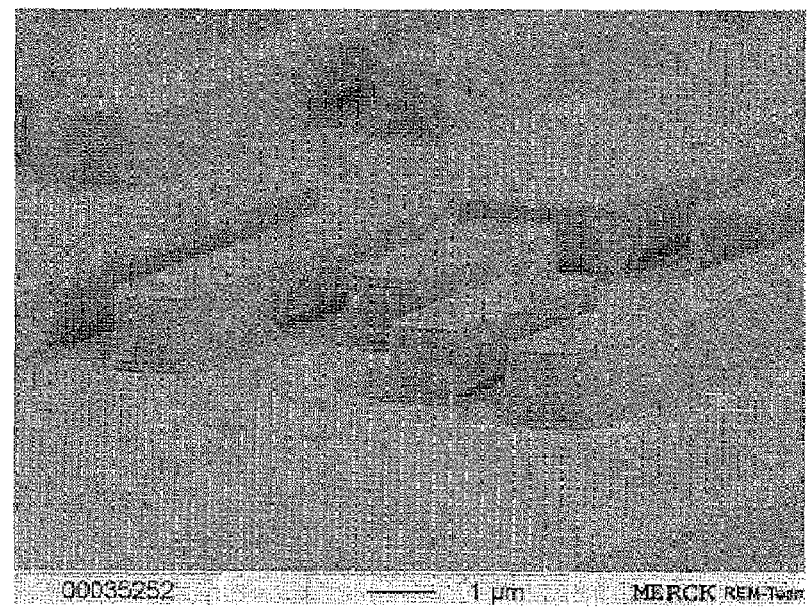
FIG. 4 shows a corresponding wafer section after stripping with a composition comprising 100 ppm of $H_2SiF_6$, FIG. 5 with 500 ppm of $H_2SiF_6$, FIG. 6 with 1000 ppm of $H_2SiF_6$.
Figure 5:
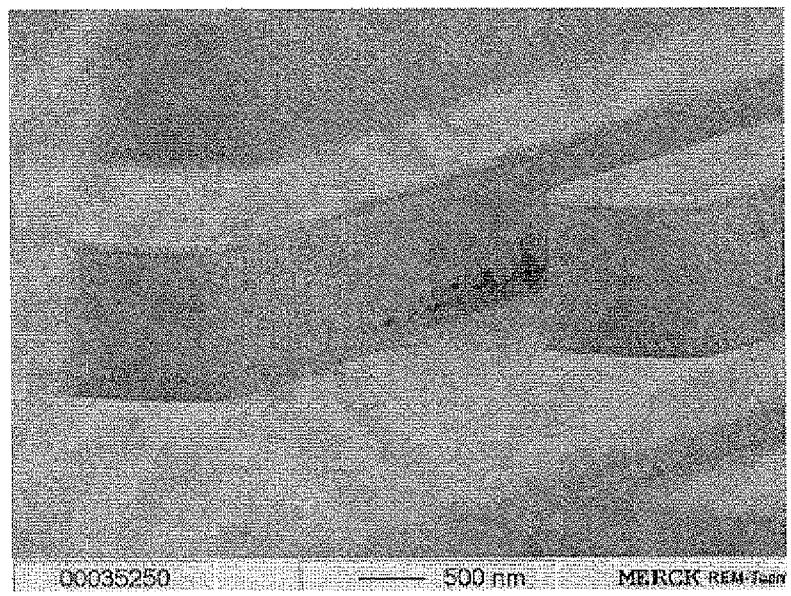
Figure 6:
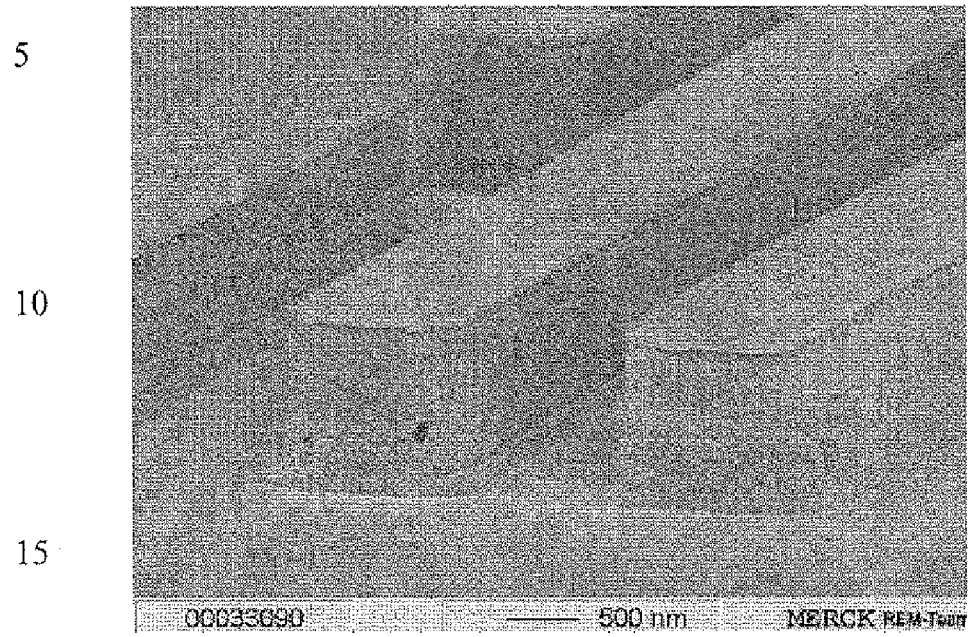
Figure 7:
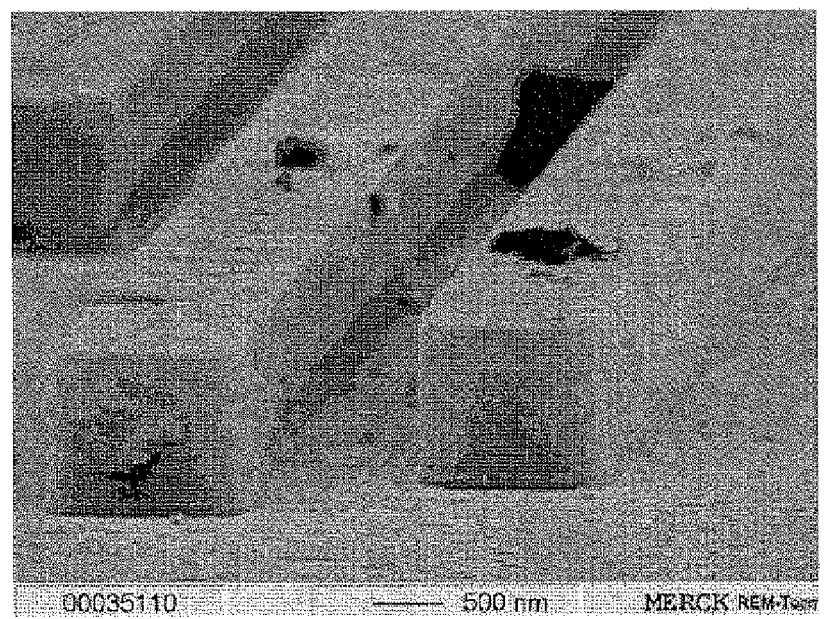
FIGS. 7-9 show results obtained under the same conditions, but using various HF concentrations.
Figure 8:
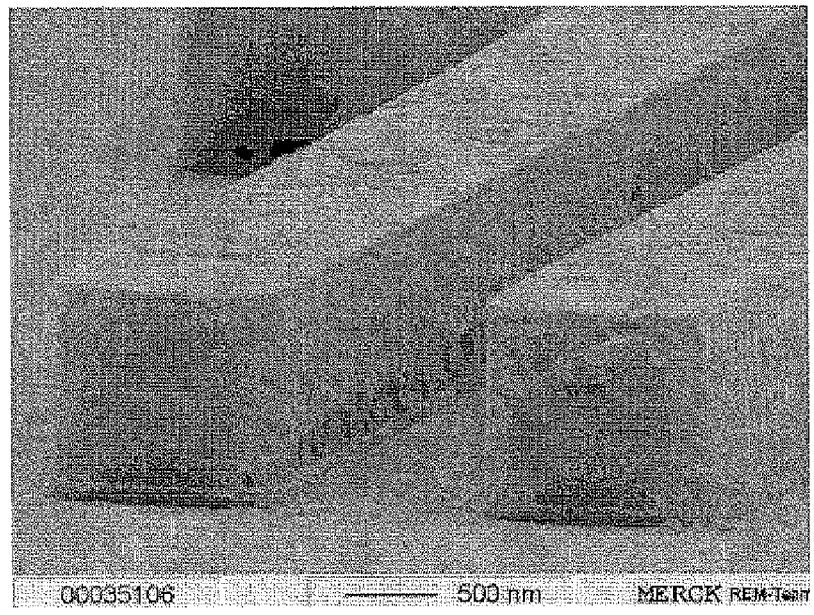
Figure 9:
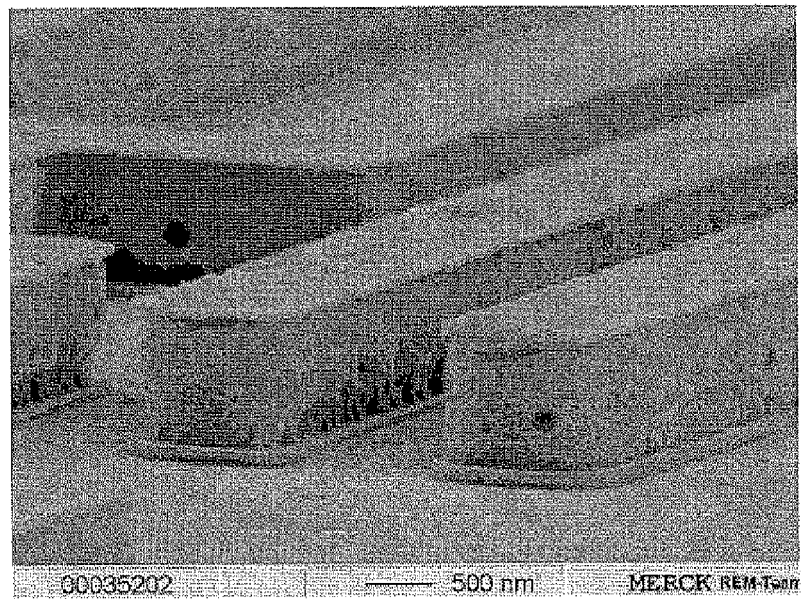
Figure 10:
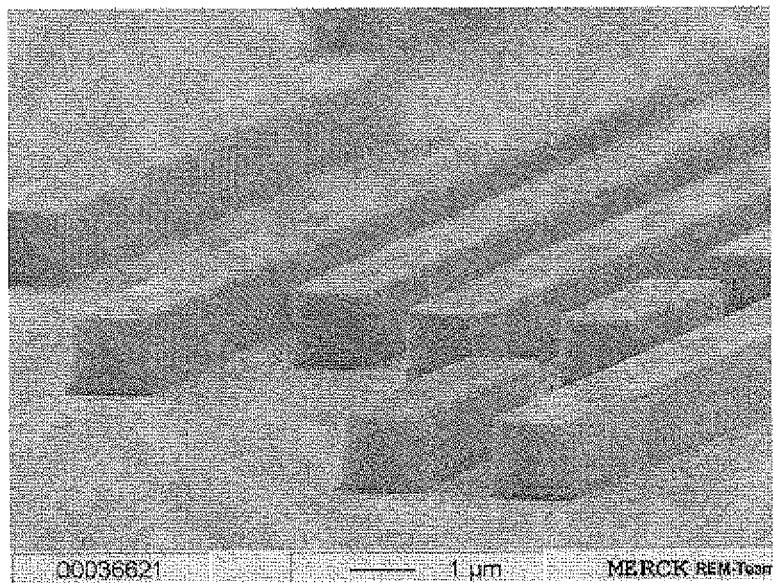
FIGS. 10 and 11 show results obtained by the removal of residual polymers in a Mattson AWP tank processor.
Figure 11:
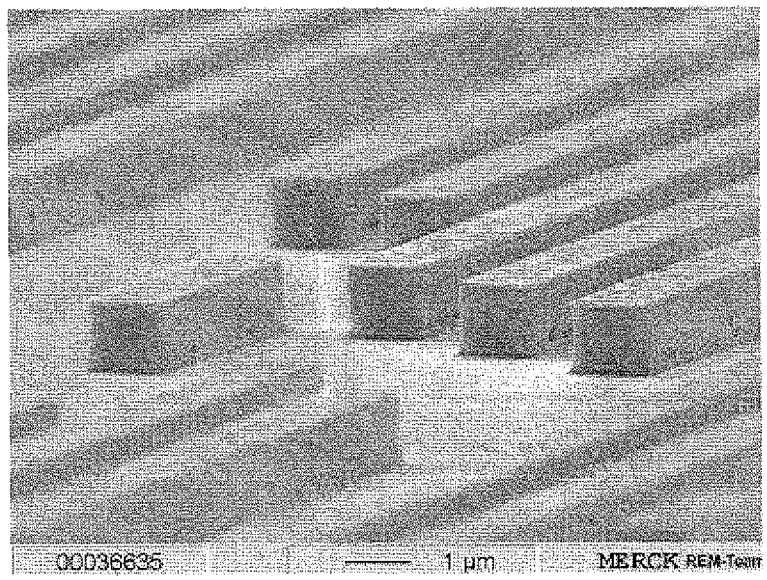
Figure 12:
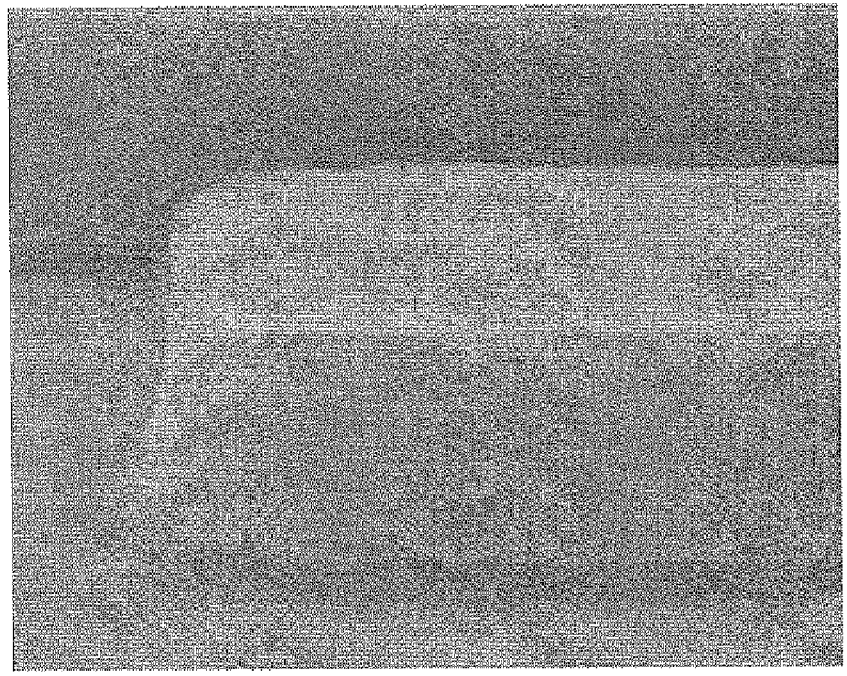
FIG. 12 shows conductor tracks after treatment with a stripper solution comprising 12% by weight of $H_2SO_4$, 2.4% by weight of $H_2O_2$, 100 ppm of $H_2SiF_6$ and added surfactant. By comparison.
Figure 13:
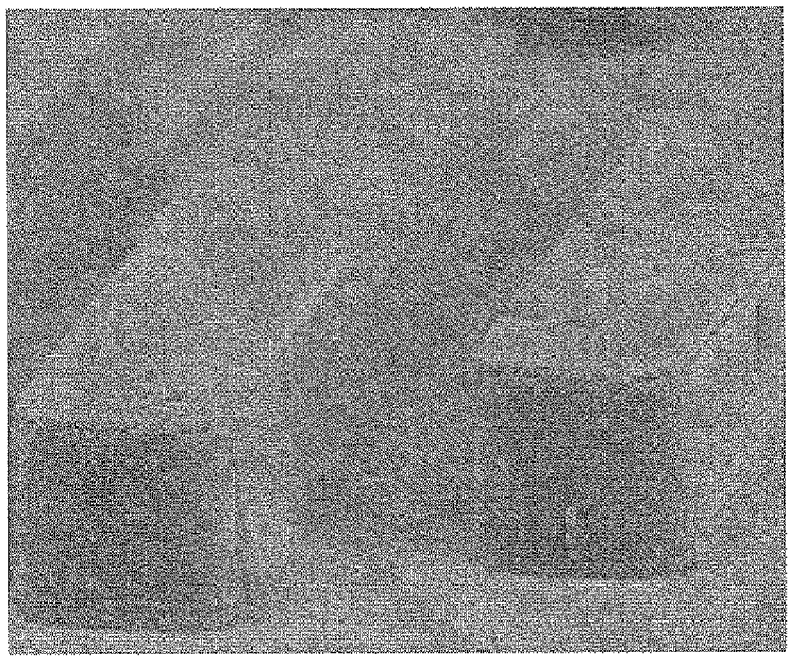
FIG. 13 shows conductor tracks after treatment with a corresponding stripper solution as in FIG. 12, but without added surfactant.

The invention claimed is:

1. A composition for the production of semiconductors, comprising $H_2SiF_6$ and/or $HBF_4$ in a total amount of 10-500 mg/kg, 12-17% by weight of $H_2SO_4$, 2-4% by weight of $H_2O_2$, optionally in combination with additives, in aqueous solution.

2. A process for the removal of residual polymers from aluminum or copper/aluminum alloys a comprising contacting a semiconductor surface having aluminum or copper/aluminum alloys with a composition according to claim 1.

3. A process for the removal of residual polymers from Al or Al-containing conductor tracks, wherein residual polymers are removed using a composition according to claim 1.

4. A process for residual polymer removal from a semiconductor surface comprising contacting a semiconductor surface with a composition comprising $H_2SiF_6$ with the structured semiconductor surface in order to remove residual polymers from the structured semiconductor surface.

5. A process according to claim 4 for the removal of residual polymers from Al or Al-containing conductor tracks on said semiconductor surface.

6. A process according to claim 4 for the removal of residual polymers after dry etching on metal conductor tracks and contact holes on said semiconductor surface.

7. A process according to claim 4 further comprising contacting a semiconductor surface with a composition comprising $H_2SiF_6$ in a spin etcher or in a tank unit.

8. The process of claim 4, wherein said composition further comprises $HBF_4$.

9. A process for residual polymer removal from a semiconductor surface comprising contacting a semiconductor surface with a composition comprising $H_2SiF_6$ and/or $HBF_4$ in a total amount of 10-500 mg/kg, 12-17% by weight of $H_2SO_4$, 2-4% by weight of $H_2O_2$, optionally in combination with additives, in aqueous solution.

10. A process according to claim 9, for the removal of residual polymers after dry etching on metal conductor tracks and contact holes on said semiconductor surface.

* * * * *